United States Patent
Takano

(10) Patent No.: US 8,136,238 B2
(45) Date of Patent: Mar. 20, 2012

(54) METHODS FOR MANUFACTURING SEMICONDUCTOR DEVICES

(75) Inventor: Michiyoshi Takano, Chino (JP)

(73) Assignee: Seiko Epson Corporation (JP)

( * ) Notice: Subject to any disclaimer, the term of this patent is extended or adjusted under 35 U.S.C. 154(b) by 368 days.

(21) Appl. No.: 12/364,756

(22) Filed: Feb. 3, 2009

(65) Prior Publication Data

US 2009/0139085 A1    Jun. 4, 2009

Related U.S. Application Data

(62) Division of application No. 11/674,705, filed on Feb. 14, 2007, now abandoned, which is a division of application No. 10/785,709, filed on Feb. 24, 2004, now abandoned.

(30) Foreign Application Priority Data

Feb. 26, 2003   (JP) ................................. 2003-048817

(51) Int. Cl.
   *H05K 3/30*   (2006.01)
(52) U.S. Cl. ............... 29/832; 29/840; 29/852
(58) Field of Classification Search ............ 29/832, 29/840, 852
   See application file for complete search history.

(56) References Cited

U.S. PATENT DOCUMENTS

| | | | |
|---|---|---|---|
| 4,283,839 A | 8/1981 | Gursky | |
| 4,670,770 A | 6/1987 | Tai | |
| 4,845,335 A | 7/1989 | Andrews et al. | |
| 5,648,136 A * | 7/1997 | Bird | 428/76 |
| 5,789,278 A | 8/1998 | Akram et al. | |
| 5,998,875 A | 12/1999 | Bodo et al. | |
| 6,028,358 A | 2/2000 | Suzuki | |
| 6,184,560 B1 | 2/2001 | Kawai | |
| 6,202,292 B1 * | 3/2001 | Farnworth et al. | 29/743 |
| 6,203,621 B1 * | 3/2001 | Tran et al. | 118/728 |
| 6,437,423 B1 | 8/2002 | Akram | |
| 6,464,790 B1 | 10/2002 | Sherstinsky et al. | |
| 7,780,005 B2 * | 8/2010 | Allison et al. | 206/460 |
| 2002/0121706 A1 | 9/2002 | Tatsuta et al. | |

FOREIGN PATENT DOCUMENTS

| | | |
|---|---|---|
| JP | 10-92907 | 4/1988 |
| JP | 4-206534 | 7/1992 |
| JP | 11-87433 | 3/1999 |

(Continued)

OTHER PUBLICATIONS

Communication from Japanese Patent Office re: related application.

*Primary Examiner* — Carl Arbes
(74) *Attorney, Agent, or Firm* — Harness, Dickey & Pierce, P.L.C.

(57) ABSTRACT

A method is provided to control the height of bump electrodes and increase a clearance between edge sections of a semiconductor chip and lead terminals of a tape substrate. By pushing up on a tape substrate by a bonding stage, and applying suction to the tape substrate through a suction groove, boundary portions of a semiconductor chip mounting region are drawn into the suction groove, and curved sections are formed in the tape substrate at locations corresponding to edge sections of a semiconductor chip and inclined sections disposed in outer circumference sections of the curved sections are formed in the tape substrate.

6 Claims, 13 Drawing Sheets

FOREIGN PATENT DOCUMENTS

| | | |
|---|---|---|
| JP | 11-121544 | 4/1999 |
| JP | 2001-274179 | 10/2001 |
| JP | 2001-298046 | 10/2001 |
| JP | 2001-351949 | 12/2001 |
| JP | 2002-009108 | 1/2002 |
| JP | 2002-124536 | 4/2002 |
| JP | 2002-305219 | 10/2002 |
| JP | 2004-6599 | 1/2004 |

* cited by examiner

METHODS FOR MANUFACTURING SEMICONDUCTOR DEVICES

CROSS-REFERENCE TO RELATED APPLICATIONS

This application is a divisional of U.S. patent application Ser. No. 11/674,705 filed on Feb. 4, 2007, which is a divisional of U.S. patent application Ser. No. 10/785,709 filed on Feb. 24, 2004. This application claims the benefit of Japanese Patent Application No. 2003-048817 filed Feb. 26, 2003. The disclosures of the above applications are incorporated herein by reference

BACKGROUND OF THE INVENTION

1. Technical Field

The present invention relates to circuit substrates, semiconductor devices, semiconductor manufacturing apparatuses, methods for manufacturing circuit substrates, and methods for manufacturing semiconductor devices, and in particular, is favorably applied to FDB (face down bonding) in COF (chip on film).

2. Conventional Technology

In conventional semiconductor devices, for example, as described in Japanese Laid-open Patent Application 2001-298046, there is a method to realize FDB in COF through Au—Au bonding by application of heat and pressure.

FIGS. 13(a) and (b) are cross-sectional views showing a conventional method for manufacturing a semiconductor device.

Referring to FIG. 13(a), Cu wiring layers 112 as inner leads are formed on a tape substrate 111, the circumference of the Cu wiring layer 112 is covered by a protection film 113, and exposed portions of the Cu wiring layers 112 are covered by Au plated layers 114.

For example, a polyimide film can be used as the tape substrate 111; and for example, a solder resist can be used as the protection film 113.

On the other hand, pad electrodes 116 are provided on a semiconductor chip 115, the circumference of the pad electrodes 116 is covered by a protection film 117, and Au bump electrodes 118 having a height H2 are formed on the pad electrodes 116.

For example, Al can be used as the pad electrodes 116; and for example, a silicon oxide film or silicon nitride film can be used as the protection film 117.

When the semiconductor chip 115 is mounted on the tape substrate 111, the tape substrate 111 is mounted on a bonding stage 101 that is heated, as indicated in FIG. 13 (b). Then, while retaining by suction the semiconductor chip by a bonding head 102, the Au bump electrodes 118 are pressed against the Cu wiring layers 112 that are covered by the Au plated layers 114.

When the Au bump electrodes 118 are pressed against the Cu wiring layers 112 that are covered by the Au plated layers 114, the tape substrate 111 below the Au bump electrodes 118 recedes, and a clearance CL2 between edge sections of the semiconductor chip 115 and the Cu wiring layers 112 covered by the Au plated layers 114 is reduced, such that the edge sections of the semiconductor chip 115 may come in contact with the Au plated layers 114.

Accordingly, in the conventional semiconductor device, to prevent the edge sections of the semiconductor chip 115 from contacting the Au plated layers 114, the height H2 of the Au bump electrodes 118 is increased.

For example, when the semiconductor chip 115 is mounted on the tape substrate 111, the clearance CL2 between the edge sections of the semiconductor chip 115 and the Cu wiring layers 112 covered by the Au plated layers 114 becomes to be about 10-12 µm. Accordingly, in order to prevent the edge sections of the semiconductor chip 115 from contacting the Au plated layers 114, the height H2 of the Au bump electrodes 118 is set to about 22.5 µm.

However, increasing the height H2 of the Au bump electrodes 118 leads to an increase in the cost because about 400-500 Au bump electrodes 118 may be provided per semiconductor chip 115, and results in greater variations in the height H2 of the Au bump electrodes 118, which leads to a problem of deteriorated connection reliability of the Au bump electrodes 118.

Accordingly, it is an object of the present invention to provide circuit substrates, semiconductor devices, semiconductor manufacturing apparatuses, methods for manufacturing circuit substrates, and methods for manufacturing semiconductor devices, which can control the height of bump electrodes, and increase the clearance between edge sections of a semiconductor chip and lead terminals of a circuit substrate.

SUMMARY

To solve the problems described above, a circuit substrate according to a first aspect is characterized in comprising: a chip mounting region for mounting a chip; a mounting substrate formed to recede at a boundary of the chip mounting region and to incline in a circumference of the chip mounting region; and lead terminals that are formed on the mounting substrate and lay over the chip mounting region.

Accordingly, without increasing the separation between the mounting substrate and the chip surface, the mounting substrate can be kept away from the edge sections of the chip.

Consequently, without increasing the height of the electrodes that connect the chip and the mounting substrate, the edge sections of the chip can be prevented from contacting the mounting substrate, and the connection reliability between the chip and the mounting substrate can be improved.

Also, a semiconductor device according to a second aspect is characterized in comprising: a circuit substrate having lead terminals formed thereon; a semiconductor chip connected to the lead terminals through bump electrodes; a concave section that is provided in the circuit substrate and disposed at a position corresponding to an edge position of the semiconductor chip; and an inclined section that is provided by inclining the mounting substrate in an outer circumferential section of the edge position.

Accordingly, the circuit substrate can be curved and bent in a manner that the circuit substrate extends away from the edge section of the semiconductor chip, and the edge section of the semiconductor chip can be prevented from contacting the circuit substrate without increasing the height of the bump electrodes.

Consequently, the material used for the bump electrodes can be reduced, such that the cost can be lowered; and the uniformity in the height of the bump electrodes is improved such that the connection reliability between the semiconductor chip and the circuit substrate can be improved.

Also, a semiconductor device according to a third aspect is characterized in that a boundary between the concave section and the inclined section and a flat section is disposed at a position outside the lead terminals and edge sections of bump electrodes of the semiconductor chip, and inside the edge section of the semiconductor chip.

Accordingly, by providing the concave section and the inclined section in the circuit substrate, the lead terminals on the circuit substrate can be kept away from the edge sections of the semiconductor chip, such that short-circuiting between the semiconductor chip and the lead terminals can be prevented even when the edge sections of the semiconductor chip come in contact with the circuit substrate.

Also, a semiconductor device according to a fourth aspect is characterized in that the concave section and the inclined section include a region between the bump electrodes and the edge position of the semiconductor chip.

Consequently, even when variations occur in the locations of the concave section and the inclined section, the mounting substrate can be kept away from the edge sections of the semiconductor chip, and the edge sections of the semiconductor chip can be prevented from contacting the circuit substrate, without affecting the height of the bump electrodes.

Also, a semiconductor manufacturing apparatus according to a fifth aspect is characterized in comprising: a bonding stage that supports a circuit substrate; a mounting device that mounts a semiconductor chip on the circuit substrate; at least one of a groove and a hole that is provided in the bonding stage at a position corresponding to the edge position of the semiconductor chip; and an inclined surface that is provided by inclining the bonding stage at an outer circumference section of the edge position.

Accordingly, by mounting the circuit substrate on the bonding stage, the semiconductor chip can be mounted, and the concave section disposed at a location corresponding to the edge position of the semiconductor chip and the inclined section disposed in an outer circumference section thereof can be collectively formed in the circuit substrate.

Consequently, while restraining the manufacturing process and the circuit substrate from becoming more complex, the clearance between the edge sections of the semiconductor chip and the lead terminals on the circuit substrate can be increased, and the height of the bump electrodes can be reduced, such that the cost can be reduced, the uniformity in the height of the bump electrodes can be improved, and the connection reliability between the semiconductor chip and the circuit substrate can be improved.

Also, a semiconductor manufacturing apparatus according to a sixth aspect is characterized in comprising: a suction device that is provided at the bonding stage to apply suction to the groove or the hole; and a suction control device that controls the suction timing by the suction device based on a heating state of the circuit substrate.

Accordingly, while avoiding the influence caused by deformation of the circuit substrate, the circuit substrate can be softened, and portions of the circuit substrate corresponding to the edge positions of the semiconductor chip can be drawn into the groove or the hole, such that the concave section disposed at positions corresponding to the edge positions of the semiconductor chip and the inclined section disposed in the outer circumference section thereof can be effectively formed.

Also, a semiconductor manufacturing apparatus according to a seventh aspect is characterized in further comprising a heating device that locally heats a region in the circuit substrate corresponding to the edge position of the semiconductor chip.

Accordingly, while inhibiting the softening of the entire circuit substrate, regions corresponding to the edge positions of the semiconductor chip can be effectively softened; and while restraining deteriorations in the mounting accuracy of the semiconductor chip, the concave sections disposed at locations corresponding to the edge positions of the semiconductor chip and the inclined section disposed in the outer circumference section thereof can be effectively formed.

Also, a semiconductor manufacturing apparatus according to an eighth aspect is characterized in that the heating device is a laser irradiating device.

Accordingly, areas corresponding to the edge positions of the semiconductor chip can be locally softened, such that, while mounting of the semiconductor chip is made possible, the concave section disposed at locations corresponding to the edge positions of the semiconductor chip and inclined section disposed in an outer circumference section thereof can be effectively formed.

A semiconductor manufacturing apparatus according to a ninth aspect is characterized in comprising: a bonding head that retains a semiconductor chip; a first temperature control device that control the temperature of the bonding head; a bonding stage that supports a tape substrate; a second temperature control device that controls the temperature of the bonding stage; at least one of a suction groove and a suction hole that is provided in the bonding stage and disposed at a position corresponding to an edge position of the semiconductor chip; an inclined surface that is provided by inclining the bonding stage in an outer circumference section of the edge position; a vacuum pump that applies suction to the suction groove or the suction hole; a clamp device that clamps the tape substrate; a first image recognition device that performs image recognition of the semiconductor chip; a second image recognition device that performs image recognition of the tape substrate; a first positioning device that positions the bonding stage in X·Y·θ directions based on a result of the image recognition by the second image recognition device; a second positioning device that positions the bonding head in X·Y·θ directions based on a result of the image recognition by the first and second image recognition devices; a first pressing device that presses the bonding stage against the tape substrate, after the bonding stage is positioned by the first positioning device; and a second pressing device that presses the semiconductor chip retained by the bonding head against the tape substrate, after the bonding head is positioned by the second positioning device.

Accordingly, while the tape substrate can be softened, the tape substrate can be accurately mounted on the bonding stage; and by drawing portions of the tape substrate into the groove or the hole formed in the bonding stage while the bonding stage is pressed against the tape substrate, the concave section disposed at locations corresponding to the edge positions of the semiconductor chip and the inclined section disposed in the outer circumference section thereof can be accurately formed in the tape substrate.

Consequently, without deteriorating the mounting accuracy, the clearance between the edge sections of the semiconductor chip and the lead terminals of the tape substrate can be increased; and the height of the bump electrodes can be reduced such that the cost can be reduced, and the uniformity in the height of the bump electrodes can be improved such that the connection reliability between the semiconductor chip and the tape substrate can be improved.

Also, a semiconductor manufacturing apparatus according to a tenth aspect is characterized in that the groove or the hole includes a region between the bump electrodes provided on the semiconductor chip and the edge position of the semiconductor chip.

Accordingly, even when a variation occurs in the location of the semiconductor chip, the circuit substrate can be kept away from the edge sections of the semiconductor chip, and the edge sections of the semiconductor chip can be prevented from contacting the circuit substrate, without affecting the height of the bump electrodes, Also, a semiconductor manufacturing apparatus according to an eleventh aspect is characterized in that the groove or the hole is chamfered or processed with corner rounding.

Accordingly, when a portion of the circuit substrate is drawn into the groove or the hole formed in the bonding stage, the circuit substrate can be prevented from being damaged.

Also, a method for manufacturing a semiconductor device according to a twelfth aspect is characterized in comprising: a step for supporting a back surface of a circuit substrate by using a bonding stage having at least one of a groove and a hole disposed at a position corresponding to an edge position of a semiconductor chip and an inclined surface provided in an outer circumference section of the edge position; a step of applying suction to the groove or the hole provided in the bonding stage; a step of mounting the semiconductor chip on the circuit substrate while applying suction to the groove or the hole; and a step of sealing with resin the semiconductor chip mounted on the circuit substrate.

Accordingly, the semiconductor chip can be mounted on the circuit substrate in a state in which the circuit substrate is fixed to the bonding stage, and the concave section disposed at locations corresponding to the edge positions of the semiconductor chip and the inclined section disposed in the outer circumference section thereof can be accurately formed in the circuit substrate.

Consequently, the semiconductor chip can be accurately mounted on the circuit substrate, and the clearance between the edge sections of the semiconductor chip and the lead terminals of the circuit substrate can be increased, such that the connection reliability between the semiconductor chip and the circuit substrate can be improved, and poor contacts of the semiconductor chip can be reduced.

Also, a method for manufacturing a semiconductor device according to a thirteenth aspect is characterized in comprising: a step of coating resin in a region inside of inner leads on a circuit substrate; a step for supporting a back surface of the circuit substrate by using a bonding stage having at least one of a groove and a hole disposed at a position corresponding to an edge position of a semiconductor chip and an inclined surface provided in an outer circumference section of the edge position; a step of applying suction to the groove or the hole provided in the bonding stage; and a step of mounting the semiconductor chip on the circuit substrate while applying suction to the groove or the hole.

Accordingly, the semiconductor chip can be mounted on the circuit substrate in a state in which the circuit substrate is fixed to the bonding stage, and the concave section disposed at locations corresponding to the edge positions of the semiconductor chip and the inclined section disposed in the outer circumference section thereof can be accurately formed in the circuit substrate; and by mounting the semiconductor chip on the circuit substrate, the semiconductor chip can be sealed with resin.

Accordingly, the manufacturing process is simplified, and the clearance between the edge sections of the semiconductor chip and the lead terminals on the circuit substrate can be increased, such that the connection reliability between the semiconductor chip and the circuit substrate can be improved, and poor contacts of semiconductor chips can be reduced.

Also, a method for manufacturing a semiconductor device according to a fourteenth aspect is characterized in comprising: a step for supporting a back surface of a circuit substrate by using a bonding stage having at least one of a groove and a hole disposed at a position corresponding to an edge position of a semiconductor chip and an inclined surface provided in an outer circumference section of the edge position; a step of mounting the semiconductor chip on the circuit substrate: and a step of applying suction to the groove or the hole provided in the bonding stage, after mounting the semiconductor chip.

Accordingly, while the semiconductor chip is allowed to be mounted on the circuit substrate, portions of the circuit substrate can be drawn into the groove or the hole provided in the bonding stage in a state in which the circuit substrate is sufficiently softened, and the concave section disposed at locations corresponding to the edge positions of the semiconductor chip and the inclined section disposed in the outer circumference section thereof can be effectively formed in the circuit substrate.

Consequently, the clearance between the edge sections of the semiconductor chip and the lead terminals of the circuit substrate can be increased, and the height of the bump electrodes can be reduced such that the cost of the bump electrodes can be reduced; and the uniformity in the height of the bump electrodes can be improved such that the connection reliability between the semiconductor chip and the circuit substrate can be improved.

Also, a method for manufacturing a semiconductor device according to a fifteenth aspect is characterized in further comprising a step of heating the circuit substrate when applying suction to the groove or the hole.

Accordingly, the circuit substrate can be softened, and portions of the circuit substrate can be effectively drawn into the groove or the hole, such that the concave section disposed at locations corresponding to the edge positions of the semiconductor chip and the inclined section disposed in the circumference section thereof can be effectively formed.

Also, a method for manufacturing a semiconductor device according to a sixteenth aspect is characterized in comprising: a step of transferring a circuit substrate having a concave section formed at a position corresponding to an edge position of a semiconductor chip and an inclined section provided in an outer circumference section of the concave section; a step of mounting the semiconductor chip on the circuit substrate that has been transferred; and a step of sealing with resin the semiconductor chip that is mounted on the circuit substrate.

Accordingly, the semiconductor chip can be mounted by using the circuit substrate having the concave section formed therein at locations corresponding to the edge positions of the semiconductor chip and the inclination in the outer circumference section of the concave section, and the clearance between the edge sections of the semiconductor chip and the circuit substrate can be increased.

Consequently, the edge sections of the semiconductor chip can be prevented from contacting the circuit substrate without increasing the height of the bump electrodes; and the material used for the bump electrodes can be reduced such that the cost can be reduced, and the uniformity in the height of the bump electrodes can be improved such that the connection reliability between the semiconductor chip and the circuit substrate can be improved.

Also, a method for manufacturing a semiconductor device according to a seventeenth aspect is characterized in comprising: a step of transferring a tape substrate; a step of clamping the transferred tape substrate; a step of performing image recognition of the tape substrate; a step of positioning a bonding stage that is provided with an inclined surface corresponding to an outer circumference position of the edge position of the semiconductor chip in X·Y·θ directions based on a result of the image recognition of the tape substrate; a step of pressing the positioned bonding stage against a back surface of the tape substrate, and bending the tape substrate along the inclined surface provided in the bonding stage; a step of applying suction to a region of a semiconductor chip corresponding to the edge position thereof through a groove or a hole provided in the bonding stage; a step of performing image recognition of the tape substrate pressed against the bonding stage and the semiconductor chip; a step of positioning a bonding head that retains the semiconductor chip in X·Y·θ directions based on a result of the image recognition of the tape substrate and the semiconductor chip; a step of pressing the semiconductor chip that is retained by the bonding head positioned against the tape substrate; a step of forming the tape substrate by using radiant heat radiating from the bonding head; a step of releasing pressing of the bonding head; a step of releasing pressing of the bonding stage; and a step of releasing the clamping.

Accordingly, the tape substrate can be accurately mounted on the bonding stage, and areas of the tape substrate adjacent to the edge positions of the semiconductor chip can be effectively softened.

Consequently, by drawing portions of the tape substrate into the groove or the hole formed in the bonding stage, deformations of the entire tape substrate can be inhibited, and the concave sections disposed at locations corresponding to the edge positions of the semiconductor chip and the inclined section disposed in the outer circumference section thereof can be accurately formed in the tape substrate.

As a result, while suppressing deteriorations in the mounting accuracy and restraining the manufacturing process from becoming more complex, the clearance between the edge sections of the semiconductor chip and the lead terminals on the circuit substrate can be increased, and the height of the bump electrodes can be reduced, such that the cost can be reduced, the uniformity in the height of the bump electrodes can be improved, and the connection reliability between the semiconductor chip and the tape substrate can be improved.

Also, a method for manufacturing a circuit substrate according to an eighteenth aspect is characterized in comprising: a step of forming lead terminals on a mounting substrate; and a step of forming a concave section disposed at a position corresponding to an edge position of a semiconductor chip and an inclined section disposed in an outer circumference section of the concave section by metal-molding of the mounting substrate.

Accordingly, while restraining the manufacturing process from becoming more complex, the concave section disposed at locations corresponding to the edge positions of the semiconductor chip and the inclined section disposed in the outer circumference section of the concave section can be stably formed in the circuit substrate; and while suppressing deteriorations in the throughput, the clearance between the edge sections of the semiconductor chip and the lead terminals of the circuit substrate can be increased.

DETAILED DESCRIPTION

A semiconductor device and its manufacturing method in accordance with an embodiment of the present invention will be described below with reference to the accompanying drawings.

Figure 1:
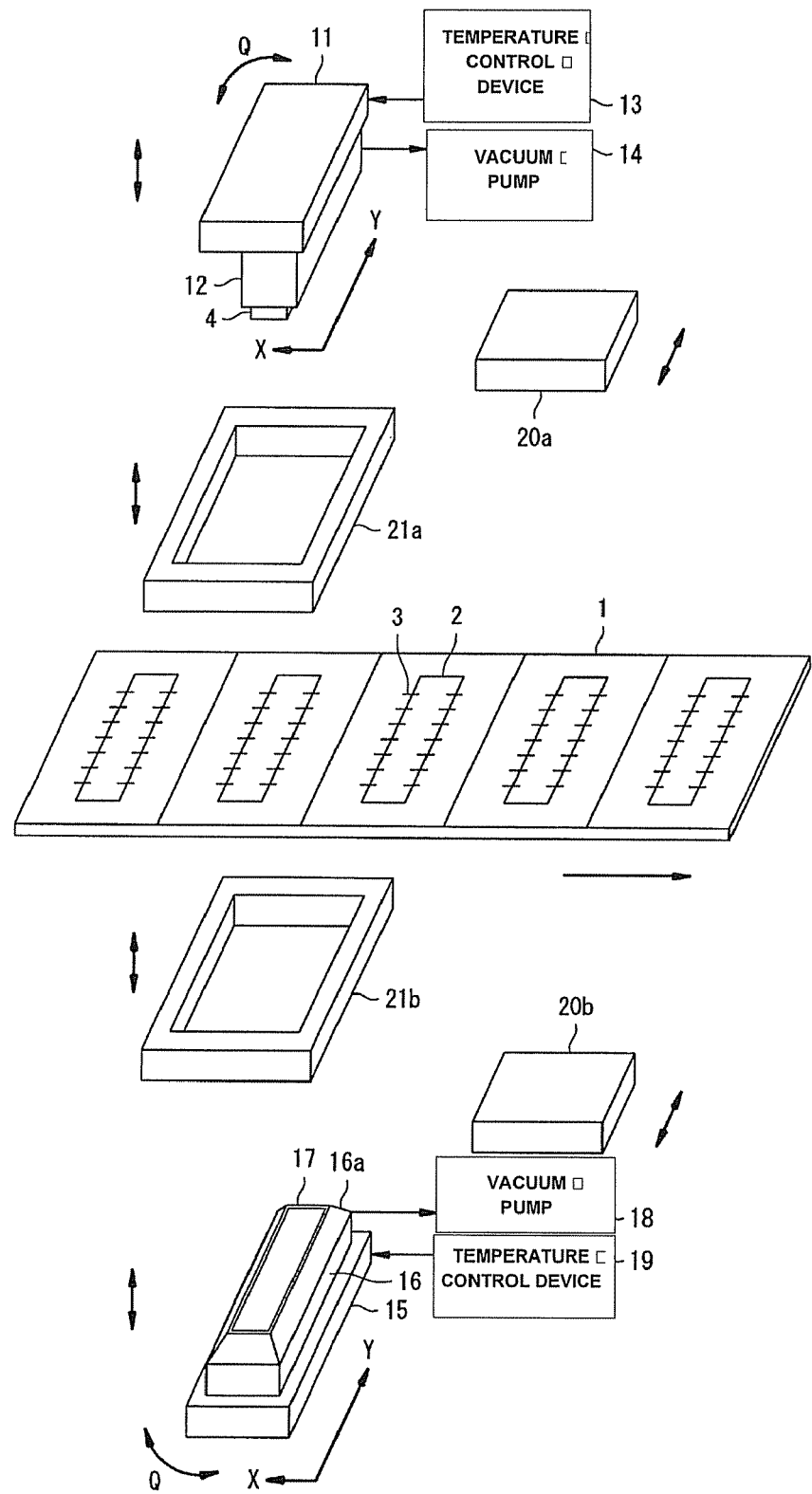
FIG. 1 schematically shows a perspective view of the structure of a semiconductor manufacturing device in accordance with a first embodiment of the present invention.

FIG. 1 schematically shows a perspective view of the structure of a semiconductor manufacturing device in accordance with a first embodiment of the present invention.

In FIG. 1, a tape substrate 1 is provided with a semiconductor chip mounting region 2 for mounting a semiconductor chip 4, and inner leads 3 formed in a manner to extend over the semiconductor chip mounting region 2. The tape substrate 1 can be composed of, for example, a polyimide film, and the inner leads 3 can be composed of, for example, Cu wiring layers plated with Au.

Also, above the tape substrate 1, a bonding head 12 that sticks by suction to a semiconductor chip 4 is provided, and a heater 11 is attached to the bonding head 12. The bonding head 12 is connected to a vacuum pump 14 that applies suction to the semiconductor chip 4, and the heater 11 is connected to a temperature control device 13 that controls the temperature of the bonding head 12.

Also, above the tape substrate 1, a camera 20a that performs image recognition of the tape substrate 1 and the semiconductor chip 4 is provided, and the position of the bonding head 12 in its X and Y directions and rotation angle θ within the X-Y plane are controlled based on the image recognition result obtained by the camera 20a.

Further, below the tape substrate 1, a bonding stage 16 that fixes the semiconductor chip mounting region 2 of the tape substrate 1 is provided. A suction groove 17 is provided in the bonding stage 16, wherein the suction groove 17 is disposed at a position corresponding to the boundary of the semiconductor chip mounting region 2. Also, an inclined surface 16a is provided in an outer circumference section of the suction groove 17.

Further, the bonding stage 16 is connected to a vacuum pump 18 that applies suction to the suction groove 17, the bonding stage 16 is provided with a heater 15, and the heater 15 is connected to a temperature control device 19 that controls the temperature of the bonding stage 16.

Also, below the tape substrate 1, a camera 20b that performs image recognition of the tape substrate 1 is provided, and the position of the bonding stage 16 in its X and Y directions and rotation angle θ within the X-Y plane are controlled based on the image recognition result obtained by the camera 20b.

Further, above and below the tape substrate 1, tape pressing frames 21a and 21b are provided, respectively, which clamp the tape substrate 1 by sandwiching circumferential areas around the semiconductor chip mounting region 2 from above and below.

It is noted that, in the embodiment shown in FIG. 1, one method in which the suction groove 17 is provided on the bonding stage 16 is indicated. However, suction holes may be disposed at locations corresponding to the boundary of the semiconductor chip mounting region 2, and the suction groove or the suction holes may be disposed at areas corresponding to the regions where the inner leads 3 are present.

Figure 2:
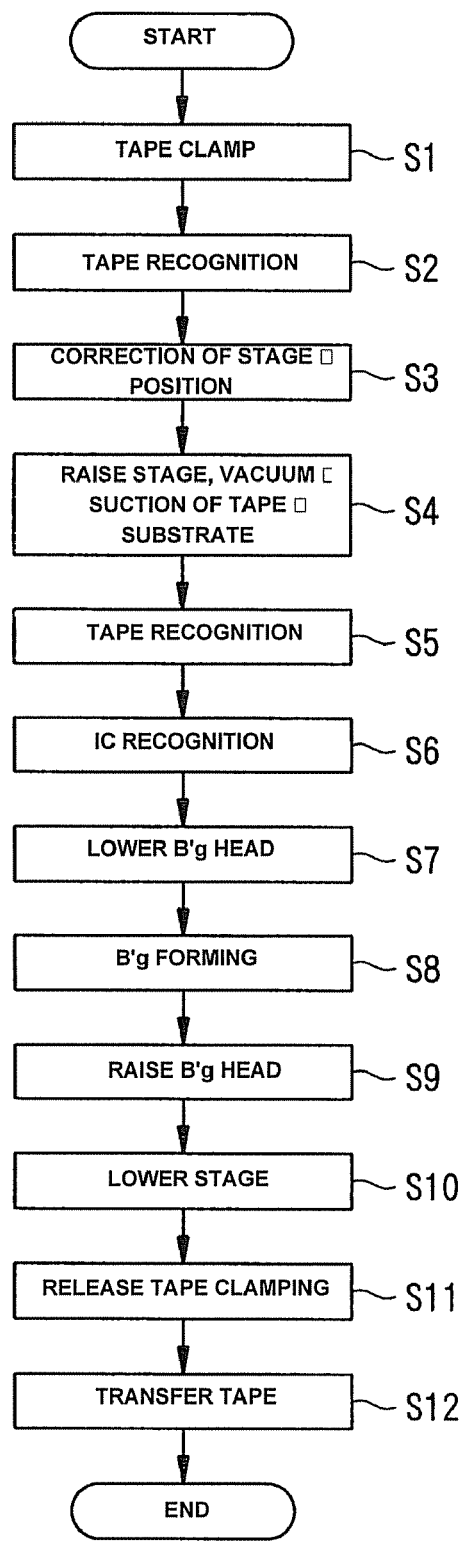
FIG. 2 is a flowchart indicating a method for manufacturing a semiconductor device in accordance with the first embodiment of the present invention.

FIG. 2 is a flowchart indicating a method for manufacturing a semiconductor device in accordance with the first embodiment of the present invention.

Referring to FIG. 2, the heater 11 is turned on, and the temperature of the bonding head 12 is adjusted by the temperature control device 13; and the vacuum pump 14 is turned on, such that the semiconductor chip 4 is retained by suction by the bonding head 12. Also, the heater 15 is turned on, and the temperature of the bonding stage 16 is controlled by the temperature control device 19.

Then, when the tape substrate 1 is transferred, the tape pressing frame 21a is lowered, and the tape pressing frame 21b is raised, to thereby sandwich the circumference area of the semiconductor chip mounting region 2 from above and below, thereby clamping the tape substrate 1 (step S1).

Here, by clamping the tape substrate 1 by using the tape pressing frames 21a and 21b, the semiconductor chip mounting region 2 of the tape substrate 1 can be fixed flat without supporting the tape substrate 1 by the bonding stage 16.

Consequently, the image recognition of the tape substrate 1 can be accurately conducted, and the bonding stage 16 can be accurately positioned. Also, since the bonding stage 16 can be moved in its 0 direction, positional deviations of the tape substrate 1 in the 0 direction can also be accommodated.

Next, when the positioning of the bonding stage 16 is completed, the bonding stage 16 is raised, and the bonding stage 16 is pressed against the back surface of the tape substrate 1; and the vacuum pump 18 is turned on, to apply suction to the tape substrate 1 (step S4).

Here, since the suction groove 17 is disposed at a location corresponding to the boundary of the semiconductor chip mounting region 2, the boundary area of the semiconductor chip mounting region 2 of the tape substrate 1 can be effectively suctioned.

Also, the bonding stage 16 is provided with the inclined area 16a in the outer circumference section of the suction groove 17, such that the tape substrate 1 can be bent at the boundary of the semiconductor chip mounting region 2 by pushing the back surface of the tape substrate 1 upward with the bonding stage 16.

Next, the camera 20a is moved into the frame of the tape pressing frame 21a, and image recognition of the tape substrate 1 and the semiconductor chip 4 is conducted by using the camera 20a (step S5, S6). Then, based on the image recognition result of the tape substrate 1 and the semiconductor chip 4, the position of the bonding head 12 is aligned in its X·Y·θ directions.

Next, when the positioning of the bonding head 12 is complete, the bonding head 12 is lowered, and the semiconductor chip 4 that is retained by suction by the bonding stage 16 is mounted on the tape substrate 1 (step S7).

Next, by using radiant heat radiating from the bonding head 12, the tape substrate 1 is softened, and a boundary area of the semiconductor chip mounting region 2 that is suctioned at the suction groove 17 is drawn into the suction groove 17, such that the boundary position of the semiconductor chip mounting region 2 is curved (step S8), and an inclined section is formed in the outer circumference section of the semiconductor chip mounting region 2 (step S8).

By curving the boundary position of the semiconductor chip mounting region 2 and bending the outer circumference section of the semiconductor chip mounting region 2, the tape substrate 1 can be separated from the edge sections of the semiconductor chip 4 when the semiconductor chip 4 is mounted on the tape substrate 1, and the clearance between the edge sections of the semiconductor chip 4 and the tape substrate 1 can be increased.

Also, by using radiant heat radiating from the bonding head 12, the boundary area of the semiconductor chip mounting region 2 can be effectively softened, such that deformation of the entire tape substrate 1 by heat can be inhibited, and deterioration of the mounting accuracy of the semiconductor chip 4 can be suppressed.

Next, upon completion of the forming of the tape substrate 1, the bonding head 12 is raised (step S9), and the bonding stage 16 is lowered (step S10), to thereby release the clamping of the tape substrate 1 (step S11), and the tape substrate 1 is transferred (step S12).

It is noted that the timing of vacuum suction by the suction groove 17 can be adjusted in view of the softened state and/or deformed state of the tape substrate 1.

Figure 3:
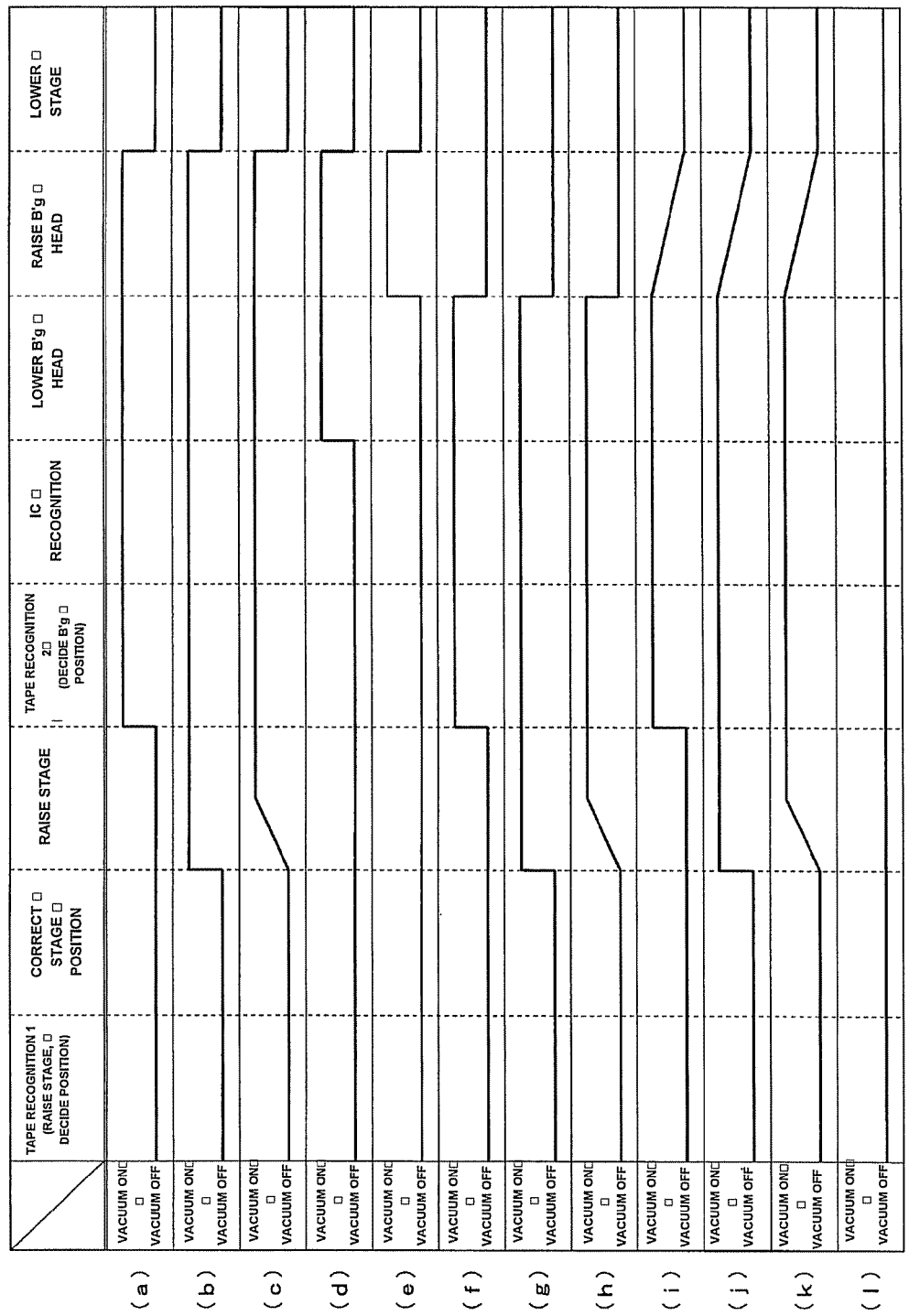
FIG. 3 is a timing chart indicating timings of vacuum suction in accordance with an embodiment of the present invention.

FIG. 3 is a timing chart indicating timings of vacuum suction in accordance with an embodiment of the present invention.

Referring to FIG. 3, after the bonding stage 16 is raised, and before image recognition of the tape substrate 1 is conducted, vacuum suction is applied to the tape substrate 1 through the suction groove 17; and then, after the bonding head 12 is raised, and before the bonding stage 16 is lowered, the vacuum suction is released.

Accordingly, image recognition of the tape substrate 1 can be conducted in a state in which the tape substrate 1 is fixed on the bonding stage 16, such that the positioning accuracy of the bonding stage 16 can be improved.

Next, referring to FIG. 3 (b), after the positioning of the bonding stage 16 is finished, and before the bonding stage 16 is raised, vacuum suction is applied to the tape substrate 1 through the suction groove 17; and then after the bonding head 12 is raised, and before the bonding stage 16 is lowered, the vacuum suction is released.

Consequently, before the tape substrate 1 starts deforming by the heat of the bonding stage 16, the tape substrate 1 can be fixed onto the bonding stage 16, and image recognition of the tape substrate 1 can be performed in a state in which the tape substrate 1 is affixed to the bonding stage 16, such that the positioning accuracy of the bonding stage 16 can be further improved.

As indicate in FIG. 3 (c), while the bonding stage 16 is raised as in FIG. 3 (b), vacuum suction can be applied to the tape substrate 1.

Next, referring to FIG. 3 (d), after image recognition of the semiconductor chip 4 is performed, and before the bonding head 12 is lowered, vacuum suction is applied to the tape substrate 1 through the suction groove 17; and after the bonding head 12 is raised, and before the bonding stage 16 is lowered, the vacuum suction is released.

Consequently, while the tape substrate 1 is softened by radiant heat radiating from the bonding head 12, portions of the tape substrate 1 can be drawn into the suction groove 17, such that the tape substrate 1 can be effectively curved at portions corresponding to the edge sections of the semiconductor chip 4.

Next, referring to FIG. 3 (e), after the bonding head 12 is lowered, and before the bonding head 12 is raised, vacuum suction is applied to the tape substrate 1 through the suction groove 17; and after the bonding head 12 is raised, and before the bonding stage 16 is lowered, the vacuum suction is released.

Consequently, while the tape substrate 1 is softened by radiant heat radiating from the bonding head 12, portions of the tape substrate 1 can be drawn into the suction groove 17, such that the tape substrate 1 can be effectively curved at portions corresponding to the edge sections of the semiconductor chip 4.

As indicated in FIG. 3 (f) through FIG. 3 (h), after the bonding head 12 is lowered, as in FIG. 3 (a) through FIG. 3 (c), and before the bonding head 12 is raised, the vacuum suction can be released. Alternatively, as indicated in FIG. 3 (i) through FIG. 3 (k), the vacuum suction can be released while raising the bonding head 12.

Consequently, the amount of radiant heat from the bonding head 12 radiated onto the tape substrate 1 can be controlled, such that the amount of portions of the tape substrate 1 drawn into the suction groove 17 can be readily adjusted.

Also, as indicated in FIG. 3 (l), without applying vacuum suction to the tape substrate 1 to be drawn into the suction groove 17, portions of the tape substrate 1 can be bent toward the suction groove 17 by the radiant heat of the bonding head 12.

Figure 4:
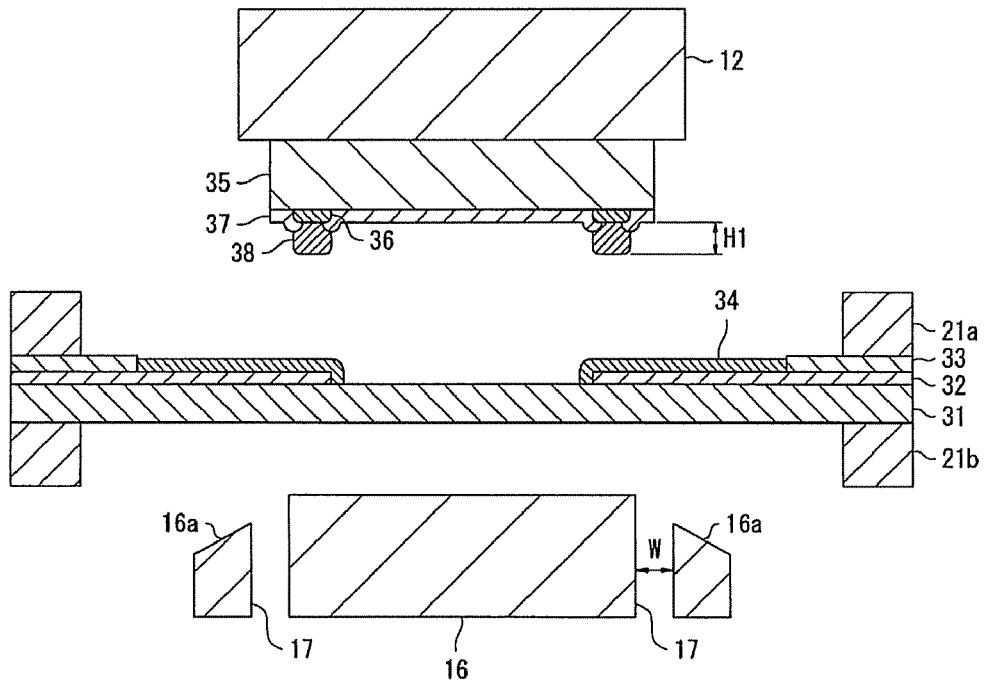
FIGS. 4(a) and (b) are cross-sectional views indicating a method for manufacturing a semiconductor device in accordance with a second embodiment of the present invention.
Figure 4:
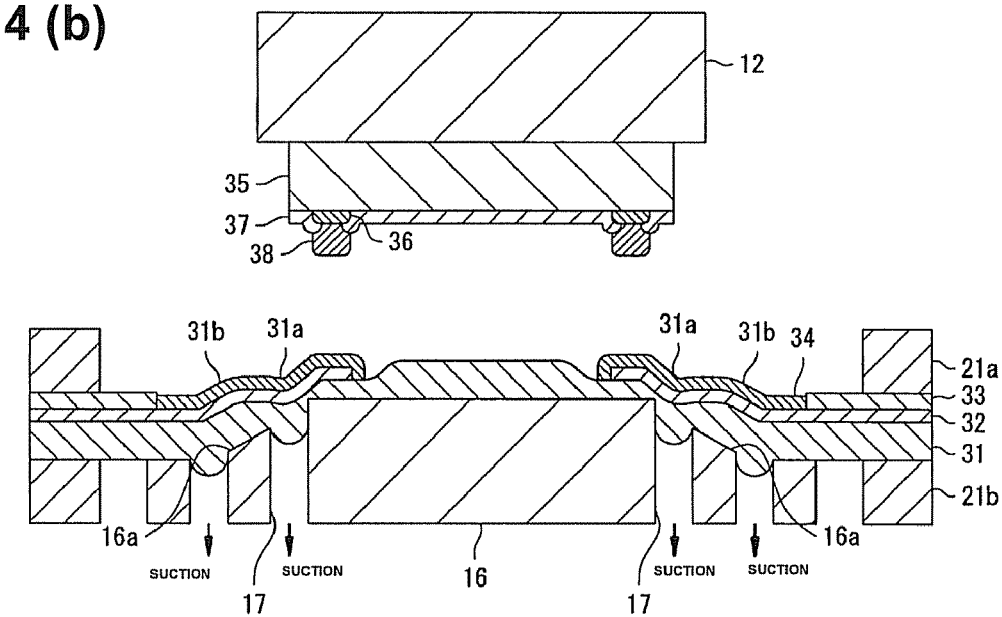
Figure 5:
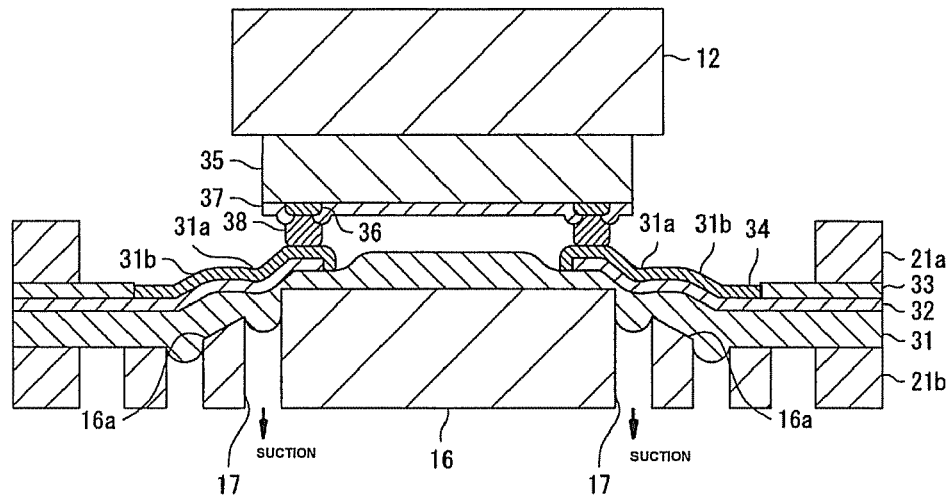
FIGS. 5(a)-(c) are cross-sectional views indicating the method for manufacturing a semiconductor device in accordance with the second embodiment of the present invention.
Figure 5:
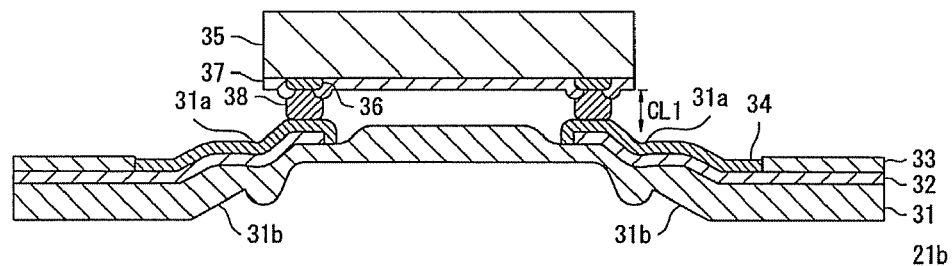
Figure 5:
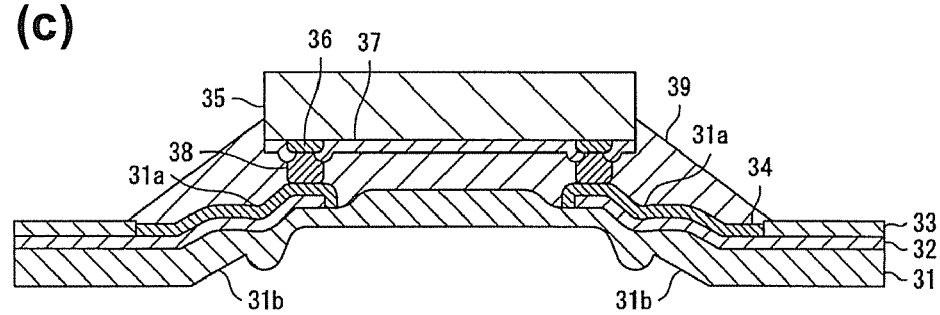

FIGS. 4 and 5 are cross-sectional views indicating a method for manufacturing a semiconductor device in accordance with a second embodiment of the present invention.

Referring to FIG. 4 (a), Cu wiring layers 32 as inner leads are formed on a tape substrate 31, the circumference of the Cu wiring layer 32 is covered by a protection film 33, and exposed portions of the Cu wiring layers 32 are covered by Au plated layers 34.

For example, a polyimide film can be used as the tape substrate 31; and a solder resist can be used as the protection film 33, for example.

On the other hand, pad electrodes 36 are provided on a semiconductor chip 35, the circumference of the pad electrodes 36 is covered by a protection film 37, and Au bump electrodes 38 having a height H1 are formed on the pad electrodes 36.

For example, Al can be used as the pad electrodes 36; and for example, a silicon oxide film or silicon nitride film can be used as the protection film 37. Also, instead of the Au bump electrodes 38, Cu bump electrodes or Ni bump electrodes that are processed with coating such as Au plating or solder plating, or solder bumps may be used.

Then, when the tape substrate 31 is transferred, the tape pressing frame 21a is lowered, and the tape pressing frame 21b is raised, thereby clamping the tape substrate 31.

Then, while the bonding stage 16 is heated by the heater 15, the bonding stage 16 is pressed against the tape substrate 31, to push up the tape substrate 31 such that the tape substrate 31 is brought into contact with the inclined surface 16a of the bonding stage 16.

When pressing the bonding stage 16 against the tape substrate 31, the bonding stage 16 is positioned such that edge sections of the semiconductor chip 35 are positioned over the suction groove 17.

Here, by clamping the tape substrate 21 by using the tape pressing frames 21a and 21b, the tape substrate 1 can be fixed flat without supporting the tape substrate 1 by the bonding stage 16, such that the bonding stage 16 can be accurately positioned.

Also, the suction groove 17 can be disposed at positions where the tape surface on which Au bump electrodes 38 are disposed does not recede, and the tape surface can recede at the edge sections of the semiconductor chip 35. For example, a region between the Au bump electrodes 38 and the edge positions of the semiconductor chip 35 may be disposed over the suction groove 17. Also, instead of the suction groove 17, suction holes may be provided, or suction grooves and suction holes may be mixed and disposed.

Then, as indicated in FIG. 4 (b), by pushing up the tape substrate 31 by the bonding stage 16, as well as applying suction to the tape substrate 31 through the suction groove 17, boundary portions of the semiconductor chip mounting region are drawn into the suction groove 17, curved portions 31a are formed in the tape substrate 31 at positions corresponding to the edge sections of the semiconductor chip 35, and inclined sections 31b disposed in the outer circumference of the curved sections 31a are formed in the tape substrate 31.

Then, as indicated in FIG. 5 (a), the semiconductor chip 35 that is retained by suction by the bonding head 12 is transferred onto the tape substrate 31, and the Au bump electrodes 38 are pressed against the Cu wiring layers 32 that are covered with the Au plated layers 34, to thereby bond the Au bump electrodes 38 to the Au plated layers 34.

Then, as indicated in FIG. 5 (b), the bonding head 12 and the bonding stage 16 are removed, and the clamping by the tape pressing frames 21a and 21b is released.

Then, as indicate in FIG. 5 (c), resin 39 is injected in areas surrounding the semiconductor chip 35 that is mounted on the tape substrate 31, to thereby seal the semiconductor chip 35.

Here, since the curved portions 31a are formed in the tape substrate 31 at locations corresponding to the edge sections of the semiconductor chip 35, and the inclined sections 31b are formed in the outer circumference section of the curved sections 31a, the tape substrate 31 can escape in a manner that the tape substrate 31 can be kept away from the edge sections of the semiconductor chip 35. Accordingly, even when the tape substrate 31 recedes at areas below the Au bump electrodes 38, a clearance CL1 between the edge sections of the semiconductor chip 35 and the tape substrate 31 can be secured.

Also, before the semiconductor chip 35 is mounted on the tape substrate 31, suction is applied to the tape substrate 31 through the suction groove 17. Consequently, the semiconductor chip 35 can be mounted on the tape substrate 31 in a state in which the tape substrate 31 is fixed on the bonding stage 16, and the curved portions 31a disposed at positions corresponding to the edge positions of the semiconductor chip 35 and the inclined sections 31b disposed in the outer circumference section of the curved sections 31a can be accurately formed in the tape substrate 31.

Consequently, the semiconductor chip 35 can be accurately mounted on the tape substrate 31 and the height H1 of the Au bump electrodes 38 can be lowered, such that the cost can be reduced, the connection reliability between the semiconductor chip 35 and the tape substrate 31 can be improved, and poor contacts of the semiconductor chip 35 can be reduced.

Figure 6:
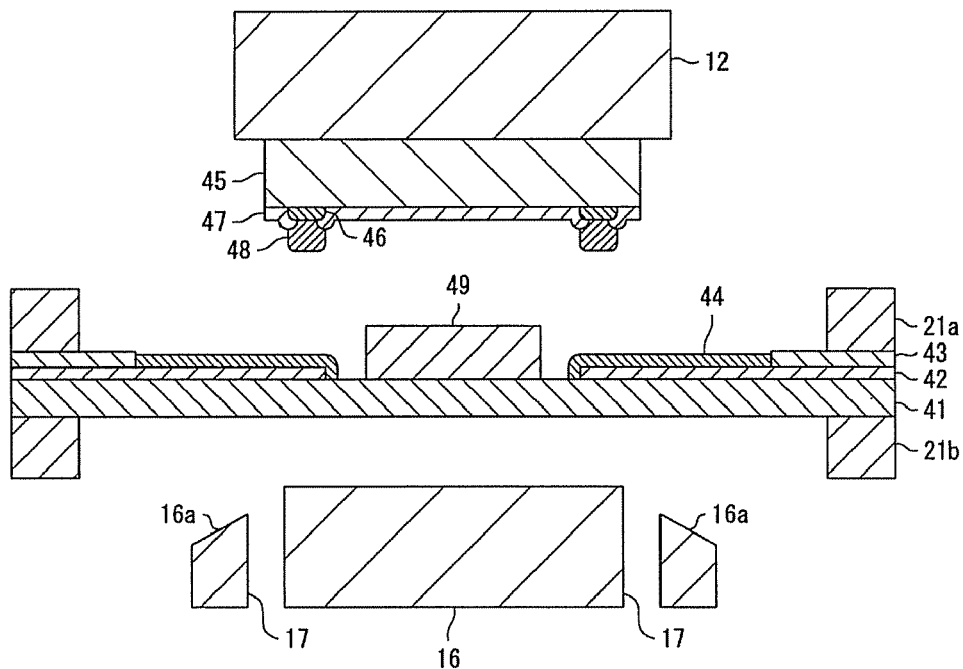
FIGS. 6(a) and (b) are cross-sectional views indicating a method for manufacturing a semiconductor device in accordance with a third embodiment of the present invention.
Figure 6:
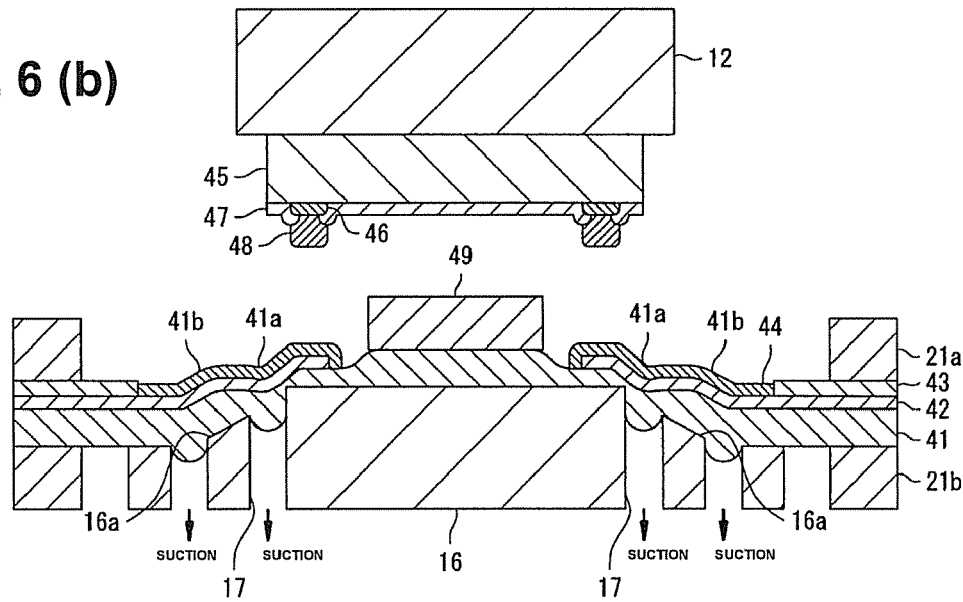
Figure 7:
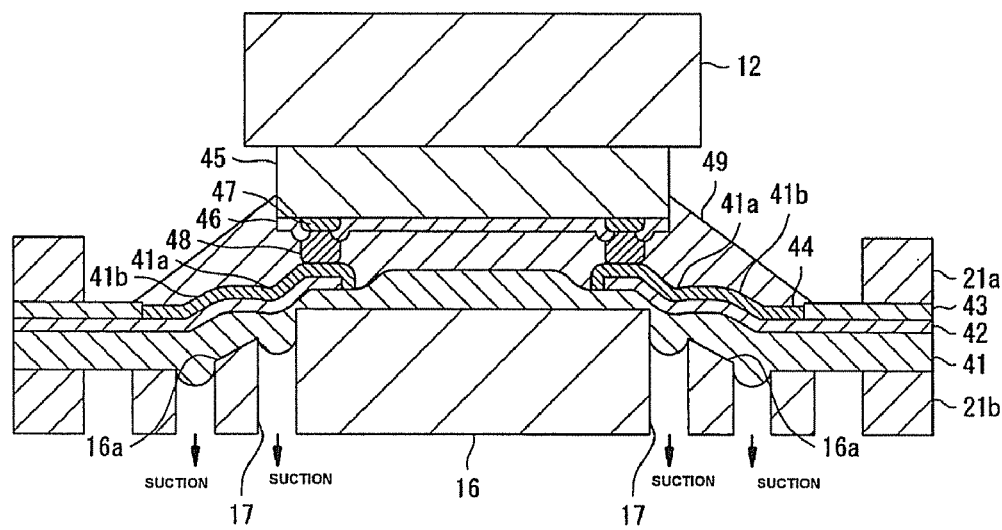
FIGS. 7(a) and (b) are cross-sectional views indicating the method for manufacturing a semiconductor device in accordance with the third embodiment of the present invention.
Figure 7:
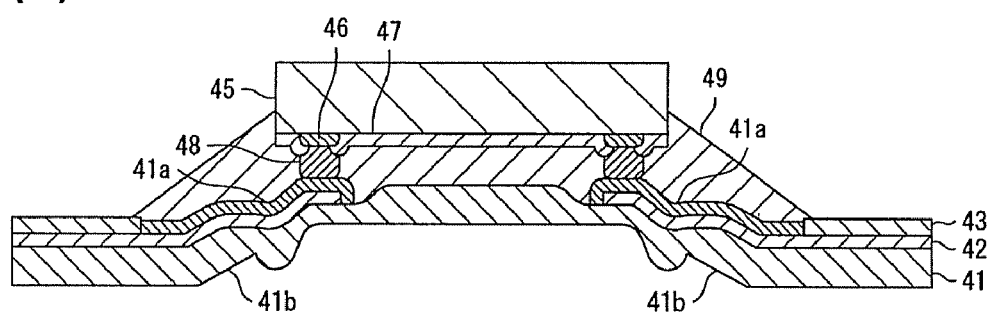

FIGS. 6 and 7 are cross-sectional views indicating a method for manufacturing a semiconductor device in accordance with a third embodiment of the present invention.

Referring to FIG. 6 (a), Cu wiring layers 42 as inner leads are formed on a tape substrate 41, the circumference of the Cu wiring layer 42 is covered by a protection film 43, and exposed portions of the Cu wiring layers 42 are covered by Au plated layers 44.

On the other hand, pad electrodes 46 are provided on a semiconductor chip 45, the circumference of the pad electrodes 46 is covered by a protection film 47, and Au bump electrodes 48 are formed on the pad electrodes 46.

Then, when the tape substrate 41 is transferred, the tape pressing frame 21a is lowered, and the tape pressing frame 21b is raised, thereby clamping the tape substrate 41.

Then, while the bonding stage 16 is heated by the heater 15, the bonding stage 16 is pressed against the tape substrate 31, to push up the tape substrate 41 such that the tape substrate 41 is brought into contact with the inclined surface 16a of the bonding stage 16, and sealing resin 49 is coated inside the Cu wiring layers 42.

When pressing the bonding stage 16 against the tape substrate 41, the bonding stage 16 is positioned such that edge sections of the semiconductor chip 45 are positioned over the suction groove 17.

Then, as indicated in FIG. 6 (b), while pushing up the tape substrate 41 by the bonding stage 16, and applying suction to the tape substrate 41 through the suction groove 17, boundary portions of the semiconductor chip mounting region are drawn into the suction groove 17, such that curved portions 41a are formed in the tape substrate 41 at positions corresponding to the edge sections of the semiconductor chip 45, and inclined sections 41b disposed in the outer circumference section of the curved sections 41a are formed in the tape substrate 41.

Then, as indicated in FIG. 7 (a), the semiconductor chip 45 that is retained by suction by the bonding head 12 is transferred onto the tape substrate 41, and the Au bump electrodes 48 are pressed against the Cu wiring layers 42 that are covered with the Au plated layers 44, to thereby bond the Au bump electrodes 48 to the Au plated layers 44, and areas around the semiconductor chip 45 mounted on the tape substrate 51 are sealed with sealing resin 49.

Then, as indicated in FIG. 7 (b), the bonding head 12 and the bonding stage 16 are removed, and the clamping by the tape pressing frames 21a and 21b is released.

Here, in the tape substrate 41, curved sections 41a are formed at positions corresponding to the edge sections of the semiconductor chip 45, and inclined sections 41b are formed in the outer circumference section of the curved sections 41a. Accordingly, even when the tape substrate 41 recedes at areas below the Au bump electrodes 48, a clearance between the edge sections of the semiconductor chip 45 and the tape substrate 41 can be secured.

Also, through mounting the semiconductor chip 45 on the tape substrate 41 after coating the sealing resin 49 on the tape substrate 41, the semiconductor chip 45 can be sealed with the sealing resin 49 at the time when the Au bump electrodes 48 and the Au plated layers 44 are connected together.

For this reason, there is no need to seal the semiconductor chip 45 with sealing resin after the semiconductor chip 45 is mounted on the tape substrate 41, the clearance between the edge sections of the semiconductor chip 45 and the tape substrate 41 can be increased, the manufacturing process is simplified, the connection reliability between the semiconductor chip 45 and the tape substrate 41 can be improved, and poor contacts of the semiconductor chip 45 can be reduced.

Figure 8:
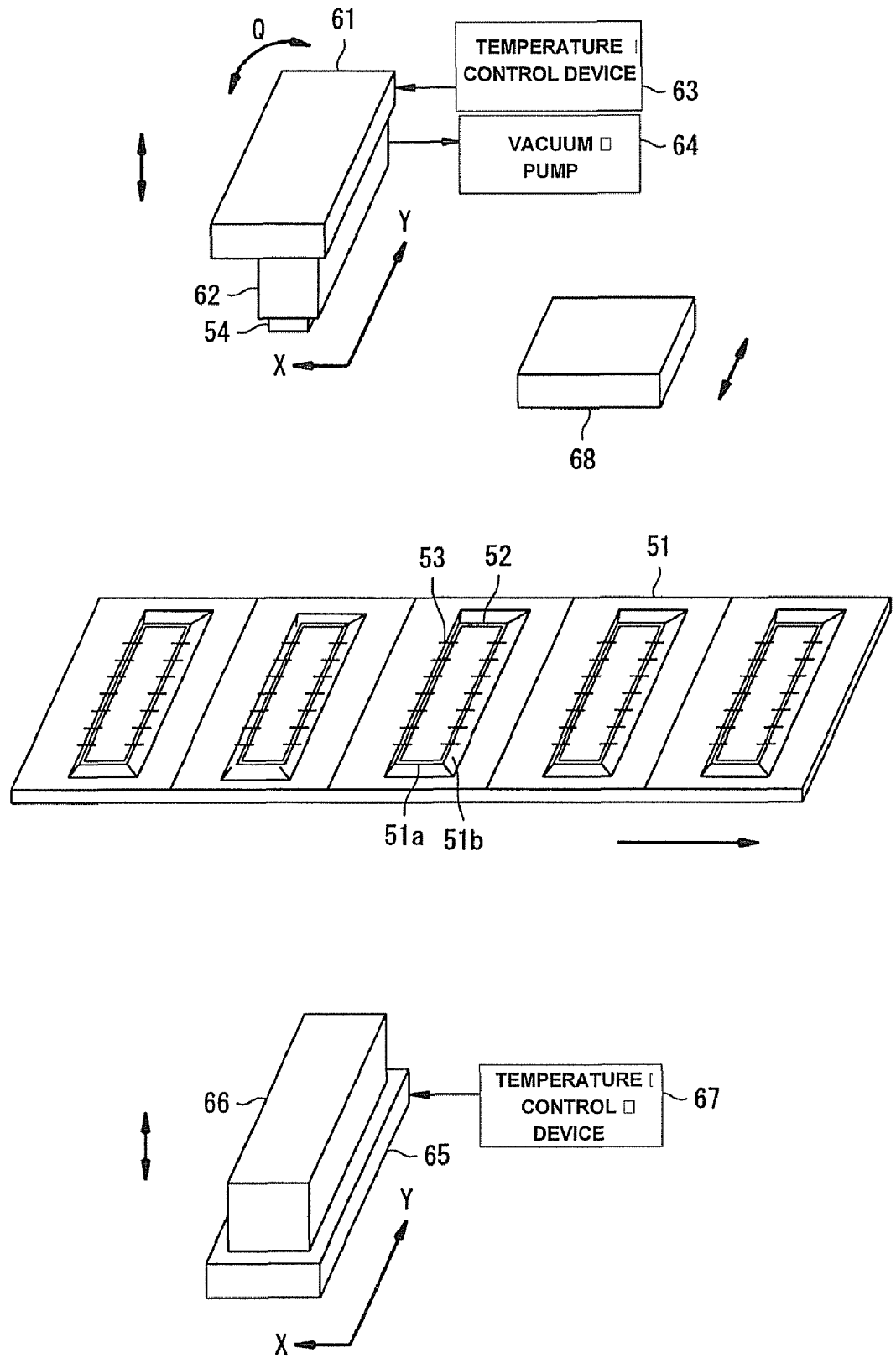
FIG. 8 schematically shows a perspective view of the structure of a semiconductor manufacturing device in accordance with a fourth embodiment of the present invention.

FIG. 8 schematically shows a perspective view of the structure of a semiconductor manufacturing device in accordance with a fourth embodiment of the present invention.

In FIG. 8, a tape substrate 51 is provided thereon with a semiconductor chip mounting region 52 for mounting a semiconductor chip 54, and inner leads 53 formed in a manner to lie over the semiconductor chip mounting region 52. Also, a concave section 51a is formed at a boundary of the semiconductor chip mounting region 52, and an inclined section 51b is formed in the outer circumference of the concave section 51a.

Further, above the tape substrate 51, a bonding head 62 that adheres by suction to a semiconductor chip 54 is provided, and a heater 61 is attached to the bonding head 62. The bonding head 62 is connected to a vacuum pump 64 that applies suction to the semiconductor chip 54, and the heater 61 is connected to a temperature control device 63 that controls the temperature of the bonding head 62.

Also, above the tape substrate 61, a camera 68 that performs image recognition of the tape substrate 51 and the semiconductor chip 54 is provided, and the position of the bonding head 62 in its X and Y directions and rotation angle θ within the X-Y plane are controlled based on the image recognition result obtained by the camera 68.

Also, below the tape substrate 51, a bonding stage 66 that fixes the semiconductor chip mounting region 52 of the tape substrate 51 is provided, a heater 65 is attached to the bonding stage 66, the heater 65 is connected to a temperature control device 67 that controls the temperature of the bonding stage 66.

Figure 9:
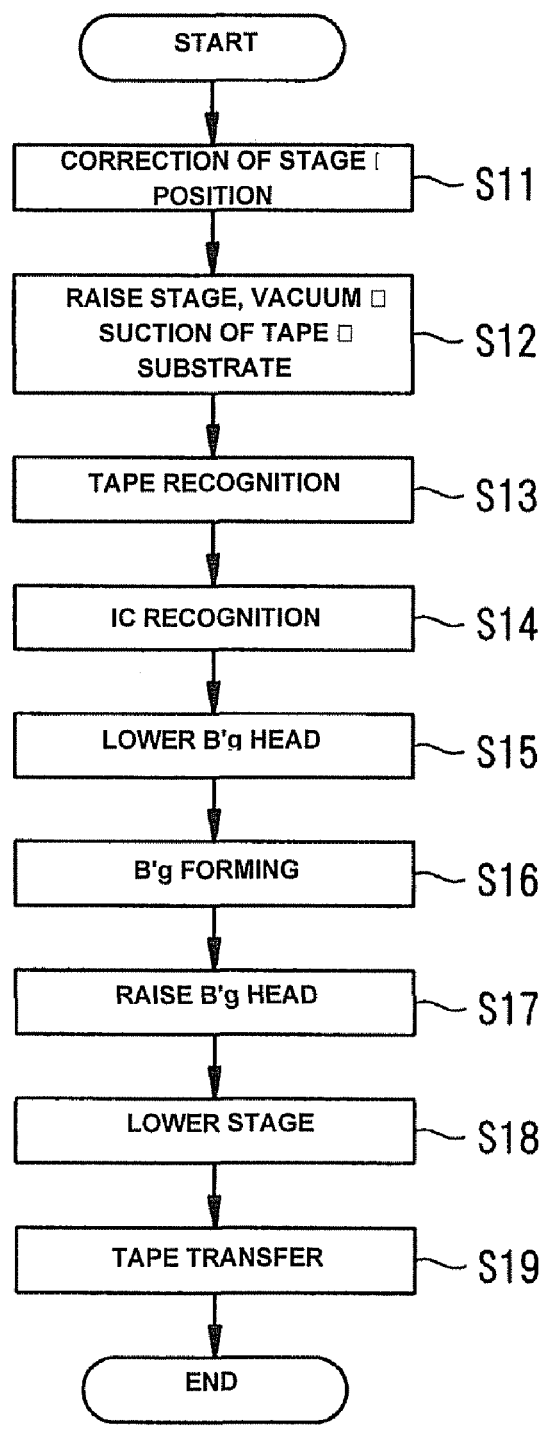
FIG. 9 is a flowchart indicating a method for manufacturing a semiconductor device in accordance with the fourth embodiment of the present invention.

FIG. 9 is a flowchart indicating a method for manufacturing a semiconductor device in accordance with the fourth embodiment of the present invention.

Referring to FIG. 9, the heater 61 is turned on, and the temperature of the bonding head 62 is adjusted by the temperature control device 63; and the vacuum pump 64 is turned on, such that the semiconductor chip 54 is retained by suction by the bonding head 62. Also, the heater 65 is turned on, and the temperature of the bonding stage 66 is controlled by the temperature control device 67.

Then, when the tape substrate 51 is transferred, and after the position of the bonding stage 66 is corrected (step S11), the bonding stage 66 is raised, to press the bonding stage 66 against the back surface of the tape substrate 51, and the tape substrate 51 is fixed by applying vacuum suction thereto (step S12).

Next, the camera 68 is moved to and over the bonding stage 66, and image recognition of the tape substrate 51 and the semiconductor chip 54 is conducted using the camera 68 (steps S13 and S14). Then, the position of the bonding head 62 is aligned in its X·Y·θ directions based on the result of the image recognition of the tape substrate 51 and the semiconductor chip 54.

Next, when the positioning of the bonding head 62 is completed, the bonding head 62 is lowered, and the semiconductor chip 54 that is held by suction by the bonding stage 66 is mounted on the tape substrate 51 (step S15).

Here, since the concave section 51a is formed in advance at the boundary of the semiconductor chip mounting region 52, and the inclined section 51b is formed in advance in the outer circumference section of the concave section 51a, the tape substrate 51 can be kept away from the edge sections of the semiconductor chip 54 when the semiconductor chip 54 is mounted on the tape substrate 51, and the clearance between the edge sections of the semiconductor chip 54 and the tape substrate 51 can be increased.

Next, by using radiant heat radiating from the bonding head 62, the tape substrate 51 is subject to forming (step S16).

Next, when forming the tape substrate 51 is complete, the bonding head 62 is raised (step S17), the bonding stage 66 is lowered (step S18), and the tape substrate 51 is transferred (step S19).

Figure 10:
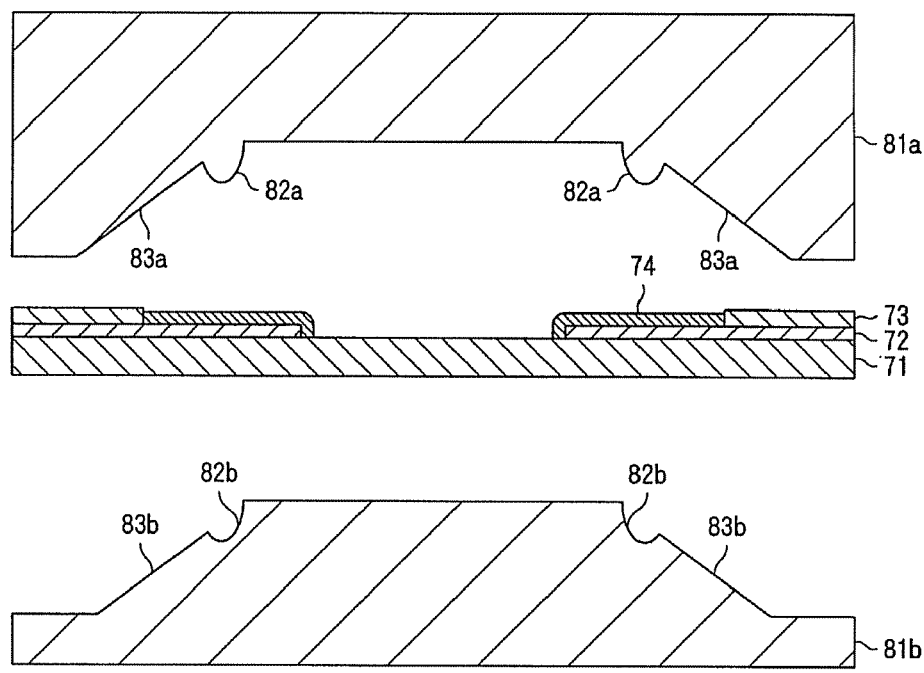
FIGS. 10(a) and (b) are cross-sectional views indicating a method for manufacturing a semiconductor device in accordance with a fifth embodiment of the present invention.
Figure 10:
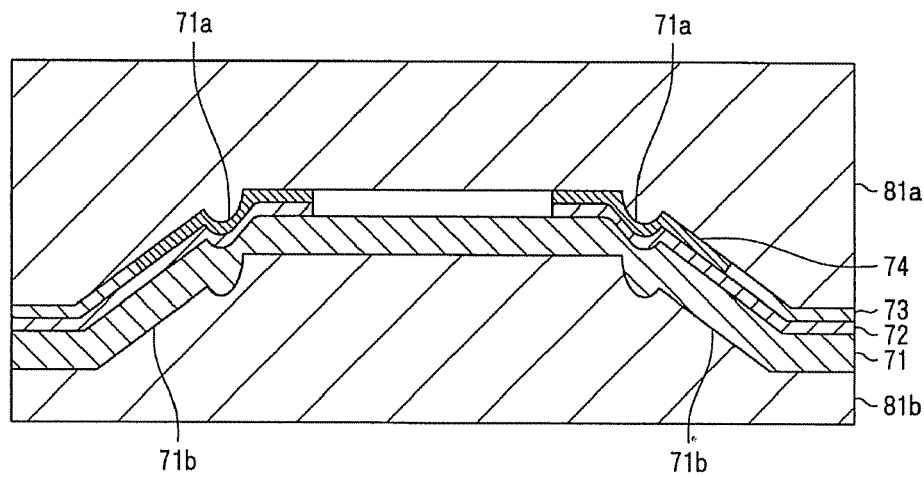
Figure 11:
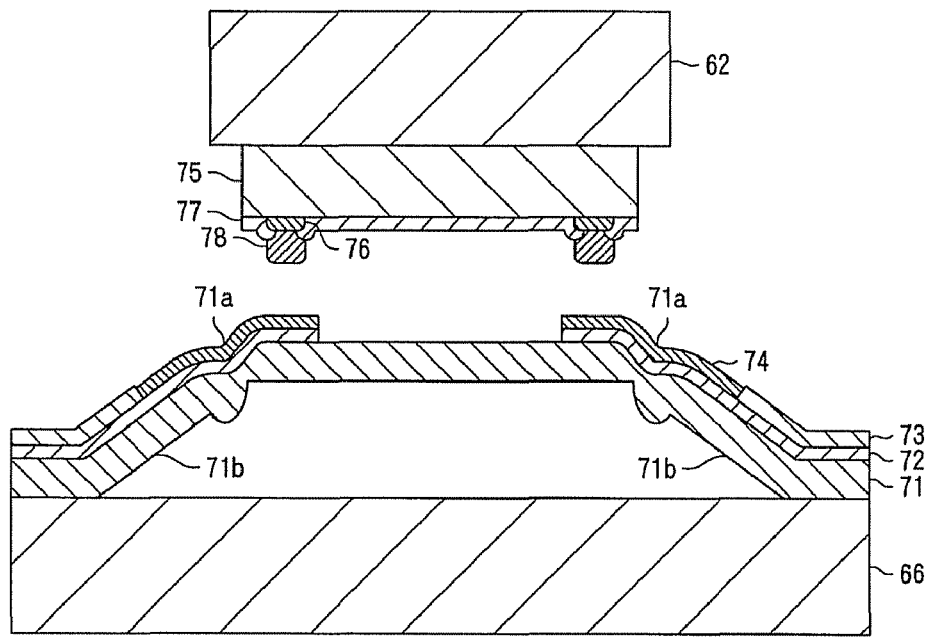
FIGS. 11(a) and (b) are cross-sectional views indicating the method for manufacturing a semiconductor device in accordance with the fifth embodiment of the present invention.
Figure 11:
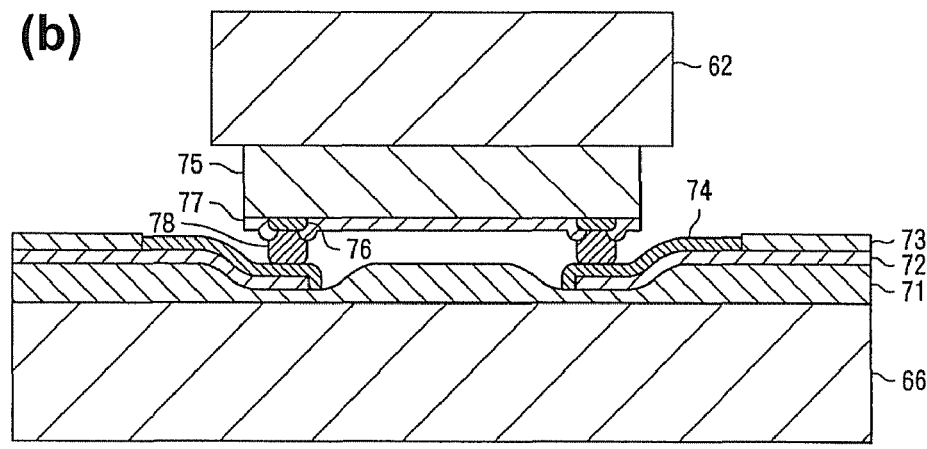
Figure 12:
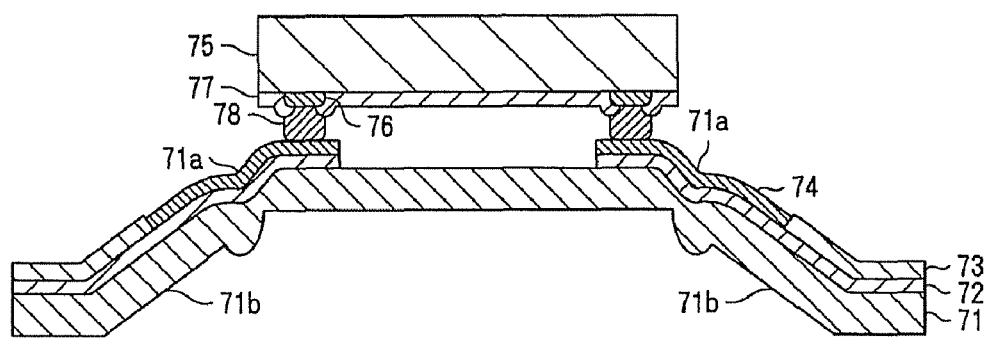
FIGS. 12(a) and (b) are cross-sectional views indicating the method for manufacturing a semiconductor device in accordance with the fifth embodiment of the present invention.
Figure 12:
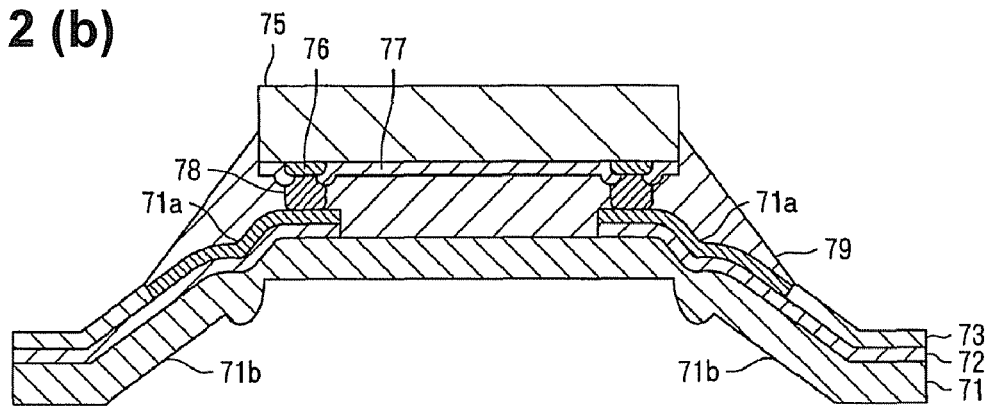
Figure 13:
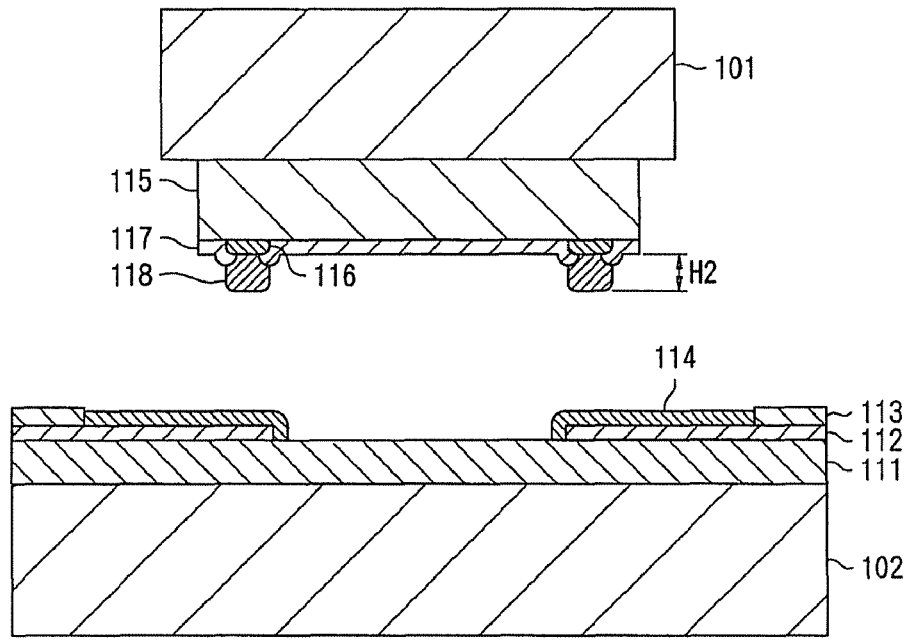
FIGS. 13(a) and (b) are cross-sectional views indicating a conventional method for manufacturing a semiconductor device.
Figure 13:
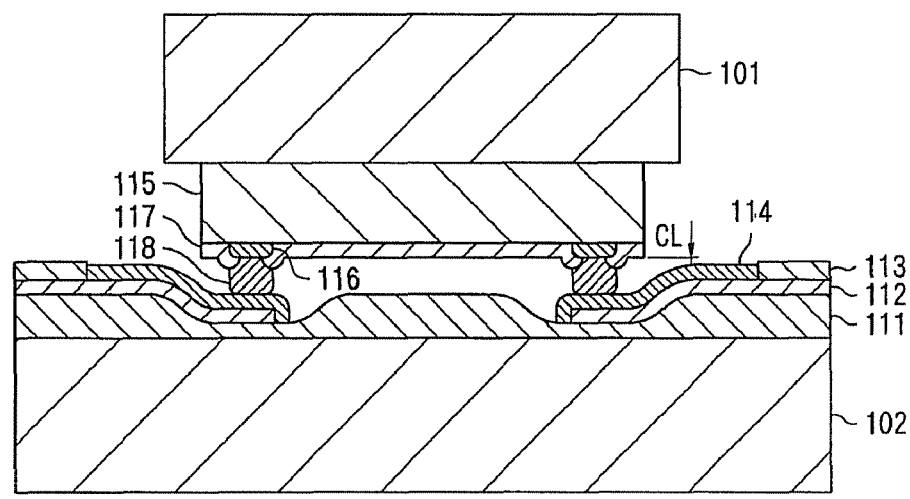

FIGS. 10 through 12 are cross-sectional views indicating a method for manufacturing a semiconductor device in accordance with a fifth embodiment of the present invention.

Referring to FIG. 10 (a), Cu wiring layers 72 as inner leads are formed on a tape substrate 71, the circumference of the Cu wiring layer 72 is covered by a protection film 73, and exposed portions of the Cu wiring layers 72 are covered by Au plated layers 74.

On the other hand, convex sections 82a are formed on a metal mold 81a at positions corresponding to edge sections of a semiconductor chip 75, and inclined surfaces 83a are provided in outer circumference sections of the concave sections 82a. Also, a metal mold 91b is provided with concave sections 82b in which the convex sections 82a can be fitted, and inclined surfaces 83b that are disposed opposite to the inclined surfaces 83a.

Then, as indicated in FIG. 10 (b), a tape substrate 71 is sandwiched by the metal molds 81a and 81b in a manner that the convex sections 82a are disposed at the boundary of the semiconductor chip mounting region of the tape substrate 71, to thereby form concave sections 71a in the tape substrate 71 at positions corresponding to the edge sections of the semiconductor chip 75, and inclined sections 71b in the tape substrate 71 disposed in outer circumference sections of the concave sections 71a.

On the other hand, as indicated in FIG. 11 (a), pad electrodes 76 are provided on the semiconductor chip 75, the circumference of the pad electrodes 76 is covered by a protection film 77, and Au bump electrodes 78 are formed on the pad electrodes 76. Then, while heating the bonding stage 66 by a heater 65, the bonding stage 66 is pressed against the tape substrate 61 having the concave sections 67a formed therein.

Then, as indicated in FIG. 11 (b), the semiconductor chip 75 that is retained by suction by the bonding head 62 is transferred to and over the tape substrate 71, and the Au bump electrodes 78 are pressed against the Cu wiring layers 72 covered by Au plated layers 74 to connect the Au bump electrodes 78 and the Au plated layers 74.

Then, as indicated in FIG. 12 (a), the bonding head 62 and the bonding stage 66 are removed, and as indicated in FIG. 12 (b), resin 79 is injected around the semiconductor chip 75 that is mounted on the tape substrate 71, to thereby seal the semiconductor chip 75.

Here, since the concave sections 71a are formed in advance at positions corresponding to the edge sections of the semiconductor chip 75, and the inclined sections 71b are formed in advance in the outer circumference sections of the concave sections 71a, a clearance between the edge sections of the semiconductor chip 75 and the tape substrate 71 can be retained even when the tape substrate 71 recedes in areas below the Au bump electrodes 78.

Also, by forming the concave sections 71a and the inclined sections 71b in the tape substrate 71 by using the metal mold forming method, there is no need to soften the tape substrate 71 at the time of mounting the semiconductor chip 75, such that deformations of the tape substrate 71 can be suppressed at the time of mounting the semiconductor chip 75, and the semiconductor chip 75 can be stably mounted on the tape substrate 71.

Accordingly, the semiconductor chip 75 can be accurately mounted on the tape substrate 71, the height of the Au bump electrodes 78 can be lowered, the cost can be reduced, the connection reliability between the semiconductor chip 75 and the tape substrate 71 can be improved, and poor contact of the semiconductor chip 75 can be reduced.

Effects of the Invention

As described above, in accordance with the present invention, by curving and bending a circuit substrate in a manner that the circuit substrate is kept away from edge sections of a semiconductor chip, the edge sections of the semiconductor chip can be prevented from contacting the circuit substrate without increasing the height of bump electrodes. Consequently, the material used for the bump electrodes can be reduced, such that the cost can be lowered, and the uniformity in the height of the bump electrodes is improved such that the connection reliability between the semiconductor chip and the circuit substrate can be improved.

What is claimed is:

1. A method for manufacturing a semiconductor device, comprising:
   supporting a back surface of a circuit substrate by using a bonding stage having at least one of a groove and a hole disposed at a position corresponding to an edge position of a semiconductor chip and an inclined surface, the inclined surface being provided outside of an outer circumference of the edge position and of the at least one of the groove and the hole;
   applying suction to the at least one of the groove or the hole provided in the bonding stage;
   mounting the semiconductor chip on the circuit substrate while applying suction to the at least one of the groove or the hole such that the edge position of the semiconductor chip is positioned over the at least one of the groove or the hole; and
   sealing with resin the semiconductor chip mounted on the circuit substrate.

2. A method for manufacturing a semiconductor device according to claim 1, further comprising heating the circuit substrate when applying suction to the at least one of the groove and the hole.

3. A method for manufacturing a semiconductor device, comprising:
   coating resin in a region inside of inner leads on a circuit substrate;
   supporting a back surface of the circuit substrate by using a bonding stage having at least one of a groove and a hole disposed at a position corresponding to an edge position of a semiconductor chip and an inclined surface, the inclined surface being provided outside of an outer circumference of the edge position and the at least one of the groove and the hole;
   applying suction to the at least one of the groove or the hole provided in the bonding stage; and
   mounting the semiconductor chip on the circuit substrate while applying suction to at least one of the groove or the hole such that the edge position of the semiconductor chip is positioned over the at least one of the groove or the hole.

4. A method for manufacturing a semiconductor device according to claim 3, further comprising heating the circuit substrate when applying suction to the at least one of the groove and the hole.

5. A method for manufacturing a semiconductor device, comprising:

supporting a back surface of a circuit substrate by using a bonding stage having at least one of a groove and a hole disposed at a position corresponding to an edge position of a semiconductor chip and an inclined surface, the inclined surface being provided outside of an outer circumference of the edge position and the at least one of the groove and the hole;

mounting the semiconductor chip on the circuit substrate such that the edge position of the semiconductor chip is positioned over the at least one of the groove or the hole; and applying suction to the at least one of the groove or the hole provided in the bonding stage, after the mounting of the semiconductor chip.

6. A method for manufacturing a semiconductor device according to claim 5, further comprising heating the circuit substrate when applying suction to the at least one of the groove or the hole.

* * * * *